Figure 1:
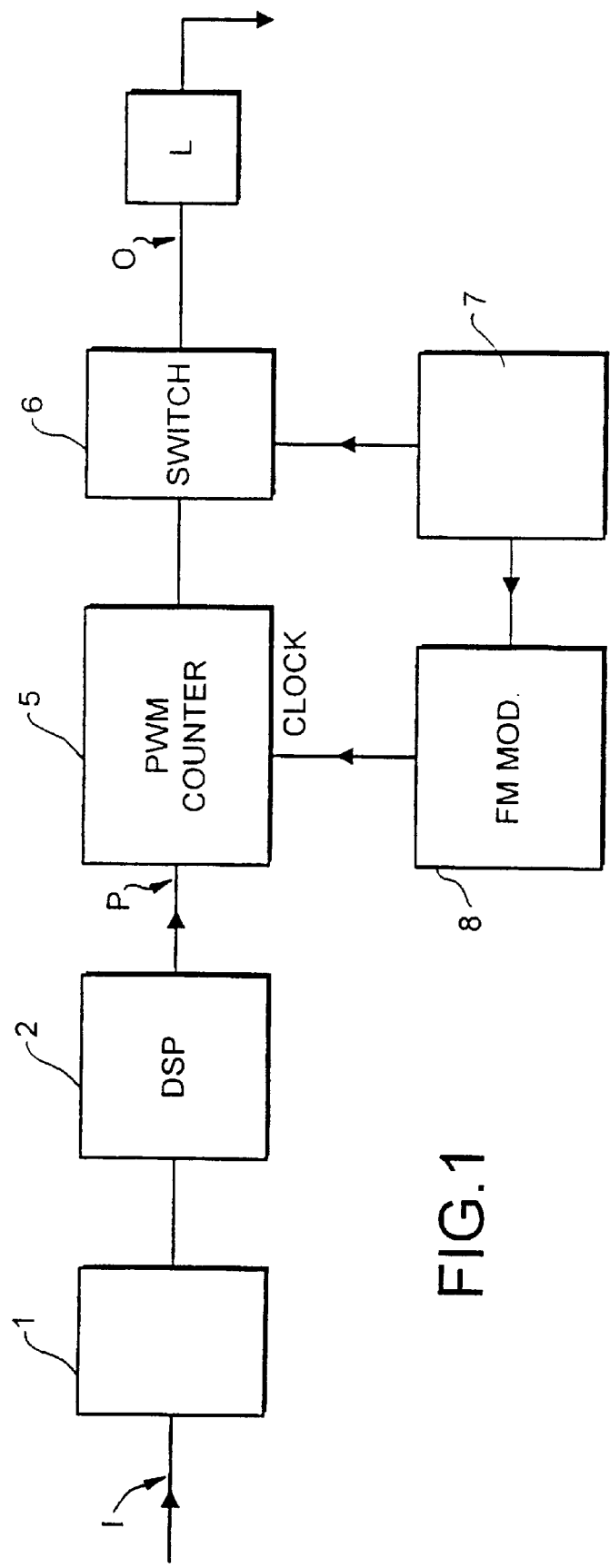

United States Patent
Newey

[11] Patent Number: 6,124,757
[45] Date of Patent: Sep. 26, 2000

[54] AMPLIFIERS

[75] Inventor: Christopher Newey, Stevenage, United Kingdom

[73] Assignee: Harman International Industries Limited, United Kingdom

[21] Appl. No.: 09/101,291

[22] PCT Filed: Nov. 6, 1997

[86] PCT No.: PCT/GB97/03017
§ 371 Date: Nov. 2, 1998
§ 102(e) Date: Nov. 2, 1998

[87] PCT Pub. No.: WO98/20608
PCT Pub. Date: May 14, 1998

[30] Foreign Application Priority Data

Nov. 6, 1996 [GB] United Kingdom ................... 9623175

[51] Int. Cl.[7] ........................................................ H03F 3/38
[52] U.S. Cl. ............................................. 330/10; 330/149
[58] Field of Search ............................. 330/10, 146, 149, 330/207 A, 251

[56] References Cited

U.S. PATENT DOCUMENTS 4,737,731 4/1988 Swanson ................................ 330/10 X
4,952,884 8/1990 Tokumo et al. ........................... 330/10
5,559,467 9/1996 Smedley .................................... 330/10

FOREIGN PATENT DOCUMENTS 0 503 571 9/1992 European Pat. Off. .

OTHER PUBLICATIONS

Patent Abstracts of Japan, vol. 003, No. 103, Aug. 31, 1979 & JP 54 080657, Jun. 27, 1979.

*Primary Examiner*—Steven J. Mottola
*Attorney, Agent, or Firm*—Nixon & Vanderhye

[57] ABSTRACT

A digital power amplifier has a digital signal processor (2) providing a digital signal representative of the original input (I). A pulse width modulation counter (5) applies a pulse width modulated output waveform to the output switching stage (6) which applies an output to a load (L) powered by a power source (7). The power source (7) is coupled to a frequency modulator (8) whose output is arranged to clock the counter (5). In this way, noise components from the power supply (7) are modulated onto the input signal applied to the output switching stage (6) and act to cancel out the noise signals applied to the output stage by the power supply, whereby an output (O) generally free of noise attributable to the power source is produced.

15 Claims, 3 Drawing Sheets

AMPLIFIERS

The present invention relates to an amplifier and to a method of reducing noise in an amplifier output. For example, the invention relates to audio amplifiers.

In a class D amplifier, a modulated input signal is switched to produce an output proportional to the input. Whilst such amplifiers are highly efficient, their output is inherently non-linear. Thus, any signal applied to the output stage via the power source will be modulated onto the output signal. For example, a 100 Hz power supply ripple would be modulated onto a 1 KHz audio tone. The non-linear output stage would then deliver the 1 KHz signal, intermodulation products at 900 Hz and 1100 Hz, and their harmonics.

The usual method of avoiding this problem is to provide a very well regulated power supply to thereby avoid or reduce power supply noise. However, such power supplies are relatively expensive.

The present invention seeks to provide an alternative solution to the problems identified.

According to the present invention there is provided an amplifier comprising an output stage to which an input signal is applied by way of input signal processing means, wherein the output stage comprises switching means for producing the output signal, and a power source coupled to said output stage, said amplifier further comprising noise reduction means arranged to apply signals from the power source to the input signal processing means such that an input signal applied to the output stage is modulated by any noise signals from the power source and is arranged to cancel said noise signals in the output stage.

Thus, in an amplifier of the invention, any noise from the power source which is applied to the output stage is also applied to the input stage and is utilised to modulate the signal input to the output stage in such a way that in the output stage the unwanted components cancel each other.

In an embodiment, the input signal processing means comprises a modulator for producing the input signal applied to the output stage. The said noise reduction means is arranged to apply said power signals to said modulator. Preferably, said noise reduction means is arranged to apply clock signals to said modulator, the clock signals being frequency modulated by signals from the power source.

In a preferred embodiment the modulator is a pulse-width modulator.

In an embodiment, a frequency modulator is arranged to apply the clock signals to the pulse-width modulator, the clock signals being frequency modulated by signals from the power source.

In an embodiment, the input signal processing means is coupled to said output stage, and the input signal is output by said input signal processing means and applied to said output stage. Of course, it is possible for intermediate stages to be provided between the input signal processing means and the output stage.

Similarly, the construction of the amplifier may be selected as required. Preferably, the amplifier is a class D amplifier, and, in a preferred embodiment, is a power amplifier.

It is also preferred that the amplifier is a digital amplifier, but the technique is equally applicable to analog circuits.

Preferably, the amplifier is an audio amplifier.

In one embodiment, the output stage incorporates a full bridge circuit. In an alternative embodiment, the output stage incorporates a half-bridge circuit.

Preferably, the output stage incorporates an H bridge power output switching circuit.

Additionally and/or alternatively to implementing the invention by hardware, it is possible to implement the required modulation function in software.

For example, in a digital amplifier, the input signal processing means may comprise a digital signal processor. Signals from the power source may be applied to the digital signal processor in conjunction with the amplifier input whereby the modulated input signal to be applied to the output stage is produced.

In one embodiment of a digital amplifier, the output of the digital signal processor is applied to the output stage by way of a pulse width modulation counter.

In an embodiment, an amplifier further comprises a pulse width modulation output stage arranged to produce two PWM output waveforms which are applied differentially to an output bridge switching circuit.

Preferably, said pulse width modulation output stage comprises a voltage controlled oscillator circuit whose frequency is determined by the power supply and which is arranged to control the period of the ON period of each PWM output waveform.

For example, each of said output waveforms may be generated by comparing the value of a digital input sample with the value held by a counter, the speed of the counter being controlled in dependence upon the power supply.

The present invention also extends to a digital power amplifier comprising a digital signal processor providing a digital signal representative of the original input, a pulse width modulation counter applying a pulse width modulated output waveform to an output switching stage which applies an output to a load powered by a power source, wherein the power source is coupled to a frequency modulator whose output is arranged to clock the counter.

According to the present invention there is provided a method of reducing noise in an amplifier output, wherein said noise is attributable to the power source, the method comprising the steps of modulating an input signal to be applied to the output stage of an amplifier by any noise signals from the power source for that output stage, and applying the modulated input signal to the output stage so as to cancel said noise signals in the output stage.

In an embodiment, the method comprises the steps of generating an output PWM waveform having a fixed period, the time ON or the time OFF period being representative of an input signal, and varying said representative period of the output waveform in dependence upon the power source.

Preferably, the method comprises the step of generating two said output PWM waveforms and applying said waveforms differentially to an output stage.

The method may further comprise determining a clock frequency in dependence upon the power source, and applying the clock to control the speed of one of more counters whereby the representative period of the or each output waveform is varied.

Figure 2:
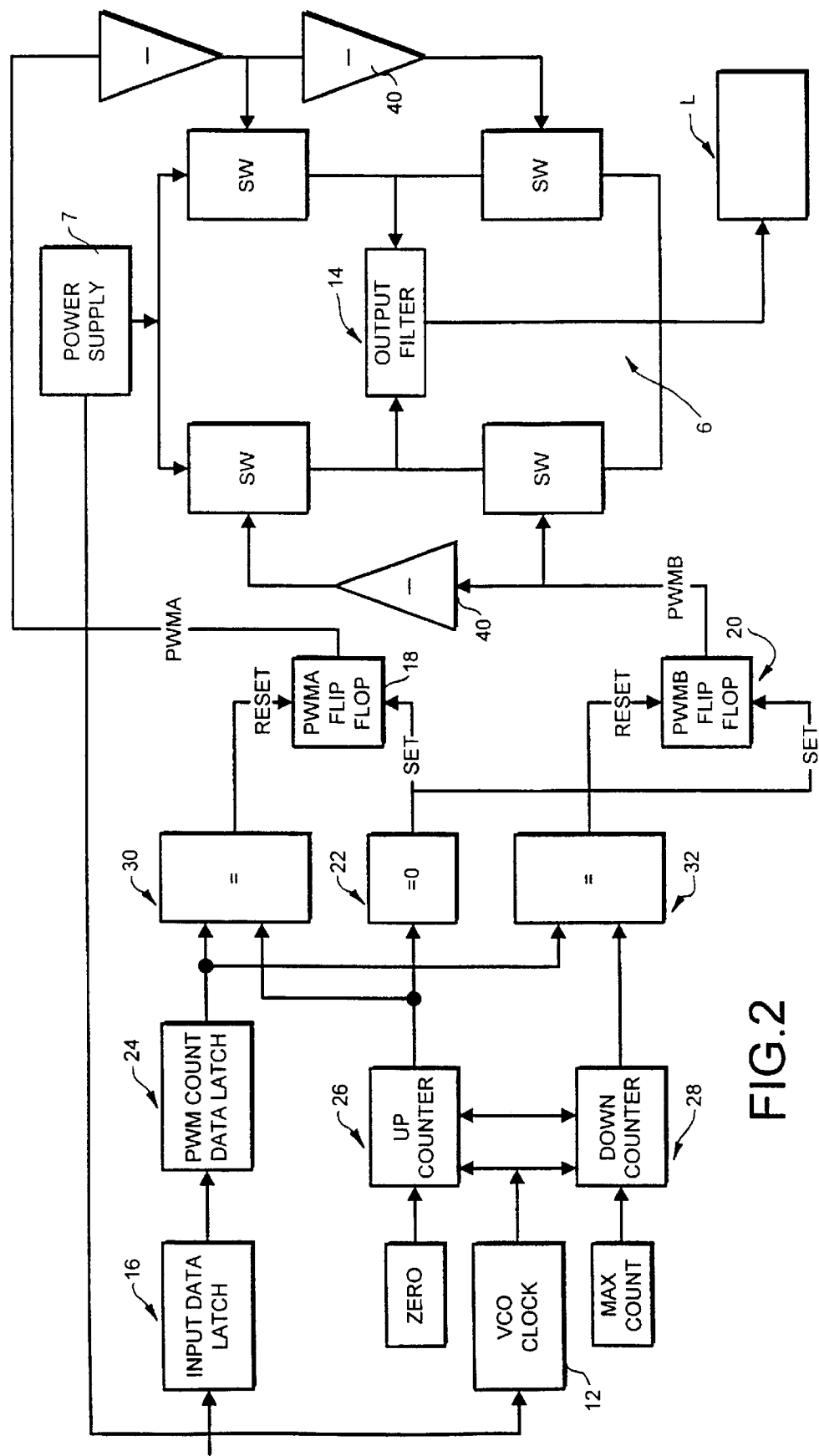
Figure 3:
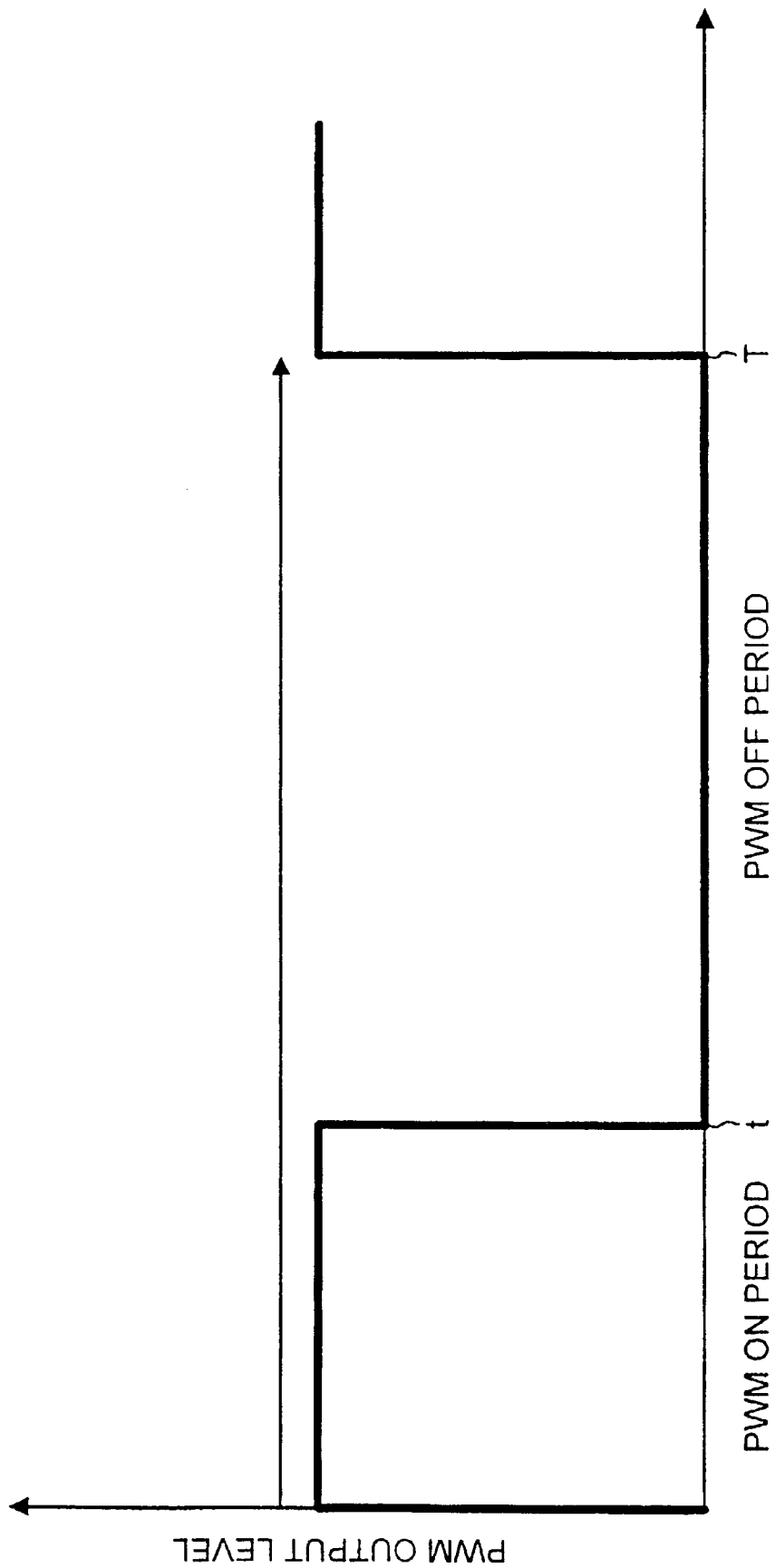

An embodiment of the present invention will hereinafter be described, by way of example, with reference to the accompanying drawings, in which:

FIG. 1 shows a block diagram of a digital, power, class D amplifier specifically for audio purposes, FIG. 2 shows, in more detail, a PWM output stage of the amplifier of FIG. 1 incorporating a voltage controlled oscillator (VCO), and FIG. 3 shows one output PWM waveform to illustrate the noise reducing adjustment.

In the amplifier as shown in FIG. 1, a digital input I is applied to a digital signal processor 2 by way of an input 1. The output P of the digital signal processor 2 is a truncated, noise shaped, over-sampled, digital signal representative of the original input signal 1. This digitally processed signal P is applied to a pulse width modulation (PWM) counter 5 whose output is applied to a high power switch 6 forming the output stage of the amplifier. The output signal 0 from the output switching stage 6 is filtered and applied to a load, indicated as L. The output switching stage 6 is powered by way of a power supply unit 7.

The amplifier as so far described is a substantially conventional digital power amplifier. The manner in which such an amplifier operates is well known and will not be further described herein.

It will be appreciated that the power supplied from the power supply unit 7 may have noise present thereon. The output switching stage 6 can be thought of as a multiplier and it will be apparent that any noise present on the power supply will modulate the output signal producing unwanted products of intermodulation in the output 0.

The amplifier of the invention also comprises, as is shown in FIG. 1, a frequency modulator 8 whose output is arranged to clock the counter 5. However, the clock signal for the counter 5 is frequency modulated by the signals from the power supply unit 7. Thus, the output of the counter 5, which is the input signal applied to the output switching stage 6, comprises the wanted representation of the amplifier input modulated with any noise present on the power supply.

The unwanted components in the signal input to the output switching stage which are attributable to the noise from the power supply unit 7 are cancelled out by the noise signals from the power supply unit applied to the output switching stage 6. Thus, the output signal 0 is generally free of noise attributable to the power source.

It will be appreciated that the circuit shown in FIG. 1 has the considerable advantage that a regulated precision power source is not required. The power supply unit 7 may be any appropriate power source, even if it has large amounts of output noise, as the amplifier circuit illustrated removes that output noise.

In the circuit shown in FIG. 1, the effect of unwanted noise is removed by a hardware noise reduction circuit. Alternatively, a software implementation would be possible. However, where the noise reduction is implemented by digital signal processing, delay can be introduced to the process thereby reducing the effective bandwidth of the control loop. It is therefore likely that the maximum frequency of the noise signals which can be reduced by a software implementation will be reduced.

FIG. 2 shows one embodiment of a PWM output stage which is comprised of the components 5, 6, 7, 8 and L of the amplifier shown in FIG. 1. The amplifier has a system clock (not shown in FIG. 2), which clocks the digital signal processor, as 2, and the other input digital circuitry and is also used to generate a fixed PWM period T as shown in FIG. 3. There is a second clock, a voltage controlled oscillator (VCO) 12, which is used to time the PWM output waveform only. As will be seen, the frequency of the VCO clock 12 is determined from the power supply 7. Input data from the digital signal processor 2 shown in FIG. 1 is applied to the PWM output stage shown in FIG. 2 and determines the length of the PWM ON period t indicated in FIG. 3. However, the period t is also varied by the frequency of the clock 12. Thus, the VCO 12 provides continuous analog control of the PWM ON period t and hence the PWM waveform fed to the output switching stage has been modulated in accordance with the frequency of the VCO 12.

As will be seen in FIG. 2, the PWM stage provides two waveforms PWMA and PWMB which are applied individually to an H bridge power output switching stage 6. The power switching signal produced by the stage 6 is filtered by an output filter 14 and applied to the load L.

In operation, the discrete digital samples from the digital signal processor, as 2, are held in an input data latch 16. At the start of a new cycle the output of a PWMA flip flop 18 and of a PWM flip flop 20 are each set to high by way of a zero latch 22. At the start of the cycle the input data in latch 16 is loaded into a PWM count data latch 24. Simultaneously, two counters 26 and 28 are loaded.

The first counter 26 is an up counter and is loaded at the commencement of a cycle with zero. The counter 28 is a down counter and is loaded at the start of a cycle with the maximum count. It will be seen that each of the counters 26 and 28 counts at a speed controlled by the VCO 12. The output of the up counter 26 is applied to a first comparator 30 and the output of the down counter 28 is applied to a second comparator 32. The data output of the PWM count data latch 24 is also fed to each comparator 30, 32.

Once the counters 26 and 28 have been loaded at the commencement of a cycle, they begin to count at a speed controlled by the VCO clock 12. The up counter 26 counts up from zero, whilst the down counter 28 counts down from its maximum count. In time, the output of each counter 26, 28 will equal the output of the PWM count data latch 24 and at that time the output of the appropriate comparator 30 or 32 will change, thereby resetting the respective flip flop 18 or 20. As a flip flop 18, 20 is reset, its output switches from high to low level. When the up counter 26 reaches its maximum count it is reloaded with zero whereby zero appears in the zero latch 22 and sets the flip flops 18 and 20 again such that their outputs go high.

As set out above, the circuit is controlled such that the PWM count period T remains fixed. However, the time at which each of the signals PWMA and PWMB go low is determined both by the absolute value of the data within the PWM count data latch 24, and by the frequency of the VCO clock 12. It will be appreciated that the signals PWMA and PWMB are applied, via respective inverters 40, to opposite sides of the bridge forming the power output switching stage 6. This means that the load L is looking at the differential between these two PWM waveforms. If, therefore, the output PWM waveform had a one to one mark space ratio, there would be no output.

Consider the case in which the data signal input is reducing. When that happens, the up counter 26 reaches the absolute value of the data sample first, so that PWMA goes low before PWMB. There is then a differential between PWMA and PWMB which drives the load L. However, this differential signal remains representative of the absolute value of the digital input data. Similarly, if the frequency of the VCO 12 changes, because of changes on the power supply 7, the differential signal changes.

The amplifier circuit as illustrated can be implemented by any appropriate circuit configurations. For example, the output switching stage 6 may incorporate a full-bridge output or a half-bridge output configuration.

It will be appreciated that further variations and modifications to the implementation of the invention as described and illustrated may be made within the scope of this application.

I claim:

1. An amplifier comprising input signal processing means having an input and an output, and an output stage coupled to the output of the input signal processing means, the signal processing means comprising a modulator for producing an input signal applied to the output stage, the output of the input signal processing means producing an input signal for application to the output stage, and the output stage comprising switching means having an output for outputting an output signal of the amplifier, the amplifier further comprising a power source coupled to power said output stage, and noise reduction means coupled to said power source and to said input signal processing means, wherein said noise reduction means is arranged to apply any noise signals from the power source to the input signal processing means such that said input signal applied to the output stage is modulated by the noise signals and thereby is arranged to cancel said noise signals in the output stage and said noise reduction means is arranged to apply said power signals to said modulator and wherein said noise reduction means is arranged to apply clock signals to said modulator, the clock signals being frequency modulated by signals from the power source.

2. An amplifier according to claim 1, wherein said modulator is a pulse width modulator.

3. An amplifier according to claim 2, further comprising a frequency modulator arranged to apply the clock signals to the pulse width modulator, said clock signals being frequency modulated by signals from the power source.

4. An amplifier according to claim 1, wherein the output stage incorporates a bridge circuit.

5. An amplifier according to claim 4, wherein the output stage incorporates an H bridge power output switching circuit.

6. An amplifier according to claim 1, wherein said amplifier is a digital amplifier.

7. An amplifier according to claim 6, wherein the input signal processing means comprises a digital signal processor.

8. An amplifier according to claim 7, wherein signals from the power source are applied to the digital signal processor in conjunction with an amplifier input whereby the modulated input signal to be applied to the output stage is produced.

9. A method of reducing noise in an amplifier output where the noise is attributable to a power source of the amplifier, the amplifier comprising an output stage having an input and an output, a power source for the output stage and a modulating means for said imput signal, wherein the method comprises the steps of modulating an input signal to be applied to the output stage by any noise signals from said power source, and applying clock signals to the modulating means for said input signal to the input of said output stage, said clock signals being frequency modulated by signals form the power source so as to cancel said noise signals in the output stage.

10. A method according to claim 9, further comprising the steps of generating an output PWM waveform having a fixed period, the time ON or the time OFF period being representative of an input signal, and varying said representative period of the output waveform in dependence upon the power source.

11. A method according to claim 10, comprising the step of generating two said output PWM waveforms and applying said waveforms differentially to an output stage.

12. A method according to claim 11, comprising the steps of determining a clock frequency in dependence upon the power source, and applying the clock to control the speed of one of more counters whereby the representative period of the or each output waveform is varied.

13. An amplifier comprising input signal processing means having an input and an output, and an output stage coupled to the output of the input signal processing means, the output of the input signal processing means producing an input signal for application to the output stage, and the output stage comprising switching means having an output for outputting an output signal of the amplifier, the amplifier further comprising a power source coupled to power said output stage, and noise reduction means coupled to said power source and to said input signal processing means, wherein said noise reduction means is arranged to apply any noise signals from the power source to the input signal processing means such that said input signal applied to the output stage is modulated by the noise signals and thereby is arranged to cancel said noise signals in the output stage and wherein said output stage incorporates a pulse width modulation output stage arranged to produce two PWM output waveforms which are applied differentially to an output bridge switching circuit.

14. An amplifier according to claim 13, wherein said pulse width modulation output stage comprises a voltage controlled oscillator circuit whose frequency is determined by said power supply and which is arranged to control the period of the ON period of each PWM output waveform.

15. An amplifier according to claim 13, wherein each of said output waveforms is generated by comparing the value of a digital input sample with the value held by a counter, the speed of the counter being controlled in dependence upon the power supply.

* * * * *